US010739688B2

(12) United States Patent
Habets

(10) Patent No.: US 10,739,688 B2
(45) Date of Patent: Aug. 11, 2020

(54) METHOD AND APPARATUS FOR FABRICATING WAFER BY CALCULATING PROCESS CORRECTION PARAMETERS

(71) Applicant: Qoniac GmbH, Dresden (DE)

(72) Inventor: Boris Habets, Dresden (DE)

(73) Assignee: Qoniac GmbH, Dresden (DE)

( * ) Notice: Subject to any disclaimer, the term of this patent is extended or adjusted under 35 U.S.C. 154(b) by 0 days.

(21) Appl. No.: 16/385,512

(22) Filed: Apr. 16, 2019

(65) Prior Publication Data

US 2019/0243255 A1    Aug. 8, 2019

Related U.S. Application Data

(63) Continuation of application No. 15/358,716, filed on Nov. 22, 2016, now Pat. No. 10,295,914, which is a continuation of application No. 13/749,740, filed on Jan. 25, 2013, now Pat. No. 9,543,223.

(60) Provisional application No. 61/590,665, filed on Jan. 25, 2012.

(51) Int. Cl.
*G06F 17/50* (2006.01)
*G03F 7/20* (2006.01)
*H01L 21/66* (2006.01)
*G05B 17/02* (2006.01)

(52) U.S. Cl.
CPC ......... *G03F 7/70633* (2013.01); *G05B 17/02* (2013.01); *H01L 22/20* (2013.01); *G05B 2219/37224* (2013.01); *G05B 2219/45031* (2013.01)

(58) Field of Classification Search
USPC .......................................................... 716/53
See application file for complete search history.

(56) References Cited

U.S. PATENT DOCUMENTS

| 5,525,808 | A  | 6/1996 | Irie et al.      |
|-----------|----|--------|------------------|
| 6,699,627 | B2 | 3/2004 | Smith et al.     |
| 6,861,331 | B2 | 3/2005 | Rossiger et al.  |
| 6,982,793 | B1 | 1/2006 | Yang et al.      |

(Continued)

FOREIGN PATENT DOCUMENTS

| EP | 1843210 A2    | 10/2007 |
|----|---------------|---------|
| JP | 2010123997 A  | 6/2010  |

(Continued)

OTHER PUBLICATIONS

Chun-Yen Huang, Ai-Yi Lee, Chiang-Lin Shih, Richer Yang, Michael Yuan, Henry Chen, Ray Chang, "Overlay Improvement by zone alignment strategy", Proc. SPIE 6922, Metrology, Inspection, and Process Control for Microlithography XXII, 69221G (Mar. 24, 2008).

(Continued)

*Primary Examiner* — Bryce M Aisaka
(74) *Attorney, Agent, or Firm* — Hodgson Russ LLP

(57) ABSTRACT

A method of calculating an overlay correction model in a unit for the fabrication of a wafer is disclosed. The method comprises measuring overlay deviations of a subset of first overlay marks and second overlay marks by determining the differences between the subset of first overlay marks generated in the first layer and corresponding ones of the subset of second overlay marks generated in the second layer.

2 Claims, 8 Drawing Sheets

(56) References Cited

U.S. PATENT DOCUMENTS

| | | | |
|---|---|---|---|
| 7,310,789 B2* | 12/2007 | Seligson | G03F 7/705 |
| | | | 716/52 |
| 7,783,444 B2 | 8/2010 | Habets et al. | |
| 2002/0042664 A1* | 4/2002 | Kikuchi | G03F 9/7003 |
| | | | 700/114 |
| 2007/0021860 A1 | 1/2007 | Gertrudus et al. | |
| 2007/0109524 A1 | 5/2007 | Kawakubo et al. | |
| 2007/0216902 A1 | 9/2007 | Smith et al. | |
| 2007/0233305 A1 | 10/2007 | Werkman et al. | |
| 2009/0153817 A1* | 6/2009 | Kawakubo | G03F 7/70633 |
| | | | 355/53 |
| 2009/0248337 A1 | 10/2009 | Habets et al. | |
| 2010/0030360 A1 | 2/2010 | Habets et al. | |
| 2011/0205510 A1 | 8/2011 | Menchtchikov et al. | |

FOREIGN PATENT DOCUMENTS

| | | |
|---|---|---|
| KR | 20060086496 A | 8/2006 |
| KR | 20070099475 A | 9/2007 |
| TW | 200801837 A | 1/2008 |
| TW | 201142534 A1 | 12/2011 |

OTHER PUBLICATIONS

Michiel Kupers et al: "Non-linear methods 1-15 for overlay control", proceedings of Spie, vol. 6518, Jan. 1, 2007 (Jan. 1, 2007), pp. 65184S-65184S-6.

* cited by examiner

METHOD AND APPARATUS FOR FABRICATING WAFER BY CALCULATING PROCESS CORRECTION PARAMETERS

CROSS-REFERENCE TO RELATED APPLICATIONS

This patent application is a continuation of U.S. patent application Ser. No. 15/358,716, entitled "Method And Apparatus For Fabricating Wafer By Calculating Process Correction Parameters" and filed on Nov. 22, 2016, which is a continuation of U.S. patent application Ser. No. 13/749,740, entitled "Method And Apparatus For Fabricating Wafer By Calculating Process Correction Parameters" and filed on Jan. 25, 2013, which claims priority to and benefit of U.S. Provisional Patent Application No. 61/590,665 filed entitled "Method and Apparatus for Fabricating Wafers" and filed on Jan. 25, 2012.

BACKGROUND OF THE INVENTION

Field of the Invention

This field of the present application relates in general to a method for the fabrication of layered planar elements and a fabrication unit for layered substantially planar elements and to a method for the processing of semiconductor wafers (including photovoltaic devices) and a fabrication unit for semiconductor wafers. The field of the application also relates to a method of calculating process correction parameters in the field of processing of semiconductor wafers.

Brief Description of the Related Art

It will be appreciated that the term "semiconductor wafer" as used in this disclosure is intended to imply wafers used in the manufacture of all types of semiconductor devices, including, but not limited to, microelectronic circuits, such as memory devices and ASICS, liquid crystal panels, and photovoltaic devices.

Current trends in the processing of the semiconductor wafers means that overlay budgets shrink with shrinking ground rules, and manufacturing processes are becoming more aggressive. Non-limiting examples of such aggressive manufacturing processes include high aspect ratio etching or deposition of exotic materials on a surface of the semiconductor wafer. The non-uniformity of some manufacturing processes over the semiconductor wafer surface and a plurality of manufacturing process steps may result in non-uniform stress being applied to the semiconductor wafer. When the semiconductor wafer deforms from one manufacturing process step to a subsequent manufacturing process step, e.g. from one lower layer to a subsequent layer on top of the lower layer, patterns in the upper layer become misaligned to patterns in the lower layer. For the error free functioning of a semiconductor the relative position of patterns on the different layers to each is relevant. These relative positional errors are termed "overlay errors". The need for smaller and denser structures on the semiconductor wafer means that an allowable tolerance for the overlay errors decreases.

The overlay error is determined by means of so-called "overlay marks". In a lower layer together with the pattern for the semiconductor structure of the process step a first set of overlay marks are exposed in a photoresist film. After developing and processing this lower layer, the first overlay mark becomes part of the structure of this lower layer. On a higher layer in a subsequent process step together with the pattern for the semiconductor structure of the higher layer, a second set of overlay marks is exposed in a photoresist film. After development of the photoresist film the relative position error between the first overlay mark on the lower layer and the second overlay mark on the top layer can be measured in an overlay measurement tool. If the tolerance of the overlay error is too large the semiconductor wafer may be reworked with applied corrections. The goal is to use the measured overlay errors to compensate for the overlay errors in a next lot of semiconductor wafers, so as to minimize the overlay errors in the next lot and thus avoid costly rework.

The concepts of alignment and overlay are different. The alignment of a semiconductor wafer is performed within an exposure tool to align semiconductor wafers prior to exposure. Typically, one alignment mark is used per exposure field. The measurement of the overlay error is performed after the exposure and development of the photoresist film when the second set of overlay marks have been formed in the layer defined by the photoresist film. There are typically several overlay marks for each exposure field.

A number of prior art documents are known for using alignment marks on the semiconductor wafer to improve overlay control. For example, US 2010/0030360 teaches a method of calculating "alignment residuals" in a fabrication unit is known that comprises providing an alignment model including alignment model parameters; providing an exposure tool suitable for exposing a lot of semiconductor wafers in a plurality of exposure fields; retrieving alignment data comprising alignment values, measured by the exposure tool on the semiconductor wafers of the lot at a plurality of positions of the exposure fields that are used to calculate values for the alignment model parameters of the alignment model; calculating a set of alignment residuals from the alignment data by subtracting effects of the alignment model parameters for each of the plurality of measured positions and for each of the semiconductor wafer in the lot; and issuing a warning signal based upon a comparison between the set of alignment residuals and a set of reference values. The US '360 document further comprises a system for calculating alignment residuals and a computer readable medium including instructions capable of performing the steps of calculating alignment residuals on a computer.

Chun-Yen Huang et al "Overlay improvement by zone alignment strategy", Proceedings of SPIE, Vol. 6922, 1 Jan. 2008, pages 69221G-1-69221G-8 teaches the so-called zone alignment strategy in which the alignment marks on the wafer are measured zone by zone in order to provide additional correction factors (residuals) for the zones on the wafer (see page 69221G-3). The method taught in Huang et al. weights the values of residuals for the neighbouring alignment marks.

Michael Kupers et al "Non-linear methods for overlay control", Proceedings of SPIE Vol. 6518, 1 Jan. 2007, pages 65184S-1-65184S-6 also teaches a method for improving overlay control by a zone-alignment strategy.

U.S. Pat. No. 5,525,808 (Irie et al, assigned to Nikon) teaches also the zone alignment strategy for the improvement of overlay. The US '808 Patent teaches a method of aligning each of a plurality of processing areas regularly aligned on substrates according to designed alignment coordinates to a predetermined reference position in a static coordinate system. The method comprises measuring coordinate positions of at least three processing areas of the wafer selected in advance. The method further comprises determining coordinate positions of the plurality of processing areas on the semiconductor substrate by weighting the coordinate positions of the three specific processing areas according to distances between the processing area of interest and each of the three specific processing areas in units of processing areas on the substrate. Finally, a statistical calculation is performed using the plurality of the weighted coordinate positions. The teachings of the US '808 patent relate once again to the alignment of the semiconductor wafer (substrate) and not to correction of overlay errors by measuring overlay deviations and calculating process correction parameters.

None of the cited documents teach the measurement of overlay deviations of a subset of first overlay marks and second overlay marks by determining the differences of subset of first overlay marks generated in the first layer and corresponding one of the subset of second overlay marks generating the second layer. The zone alignment strategy disclosed in the art uses alignment marks, which are used to align the wafer within the exposure tool. These alignment marks are different than the overlay marks formed in different layers on the semiconductor wafer.

Ideally overlay measurements should be taken for each one of the semiconductor wafers after exposure of the photoresist layer at multiple positions on each exposure field on each of the semiconductor wafers to achieve a degree of precision and thus to achieve high yield rates for the fabrication of the semiconductor wafers. However, complete overlay measurements are very slow to perform, so they may cause a tool capacity problem. In other words, the time taken to perform a complete overlay measurement is a multiple of the time taken to process the semiconductor wafer. Thus, in order to provide the overlay measurements of each of the semiconductor wafers, a number of overlay measurement units has to be provided to distribute the overlay measurements on several parallel organised overlay measurement units.

The overlay measurement units are a significant cost factor in a semiconductor manufacturing process and for cost reasons the deployment of the parallel organised overlay measurements units is avoided. Another solution for reducing limitations in the semiconductor manufacturing process whilst not extending the number of the overlay measurement units is to measure the overlay measurements in only a subset of the semiconductor wafers.

SUMMARY OF THE INVENTION

It is an aspect of the teachings of this application to provide a method of calculating an overlay model in a unit for the fabrication of a wafer comprising a structural pattern on a substrate and having first overlay marks generated in a first layer and second overlay marks generated in a second layer. The method comprises measuring overlay deviations by comparing a subset of the first overlay marks with corresponding ones of the subset of second overlay marks, thus providing a subset of overlay model parameters. The method further comprises for a plurality of overlay positions estimating the overlay deviations using the overlay model parameters, thereby generating an amended overlay model. The overlay model parameters are used to generate process correction parameters derived from the overlay deviations for the fabrication of the wafer.

The first overlay marks serve as reference marks and may be marks that have been generated in the substrate or the first layer (or a further layer) of the wafer, for example by etching. The second overlay marks are marks generated in a subsequent lithography step. As the process steps between the generating of the first overlay marks and the generating of the second overlay marks may have caused changes in the wafer geometry the second overlay marks may deviate in expected position. The overlay deviations can be calculated on a limited number of overlay marks to assess deviations of the wafer and/or the exposure field for a larger region. The larger region may comprise the whole of a wafer surface. From a subset of all of the available overlay marks, the overlay deviations can be calculated to assess deviations restricted to smaller regions of the wafer.

It will be appreciated that the wafer can be a wafer for microelectronic circuits, such as memory devices or ASICS, liquid crystal panels as well as photovoltaic devices.

This overlay model enables the modeling of a surface of the wafer separately for larger regions and for smaller regions. A finding of the present disclosure is to use not all available overlay marks to calculate the overlay model parameters, as this calculation may consume too much time. Instead the process correction parameters are calculated on the basis of only a subset of the overlay marks. Any further positions on the wafer of interest are then estimated on basis of the overlay deviation by interpolation. This saves the time to measure all of the deviations of the overlay marks.

Another aspect of the teachings of this disclosure is the selection of a subset of the overlay marks in dependence of the distance to the overlay position. The overlay model parameters and in one aspect of this disclosure be weighted and summed thereby generating the amended overlay model.

To estimate the deformation of the wafer for an arbitrary overlay position a discrete number of the closest measured overlay marks may be selected, for example always the closest four overlay marks, in one aspect of this disclosure. Another aspect of the present disclosure proposes the selection of a variable number of overlay marks according to their distance to the overlay position for which the estimated process correction parameters are calculated. This makes the estimation more precise as only those overlay marks are included in the calculation of the overlay deviation that are deemed to be correlated to the local deformations of a small region of the wafer. As the selected overlay marks are weighted according to their distance to the overlay position for which the calculation of the deviation is performed, the overlay marks closer to the overlay position in question are given more influence and usually the process correction parameters are more precise than without weighting the deviations of the overlay marks.

Another aspect of the teaching of this application is that the method further comprises storing the amended overlay model for a plurality of lots of the semiconductor wafers and weighting the amended overlay parameters depending on the number of the lot. With this aspect of the present disclosure the modeling of overlay deviations across semiconductor wafers of a semiconductor lot is improved Another aspect of the teaching of this application is a method for aligning and exposing a semiconductor wafer with a structural pattern having first overlay marks and second overlay marks in an exposure device. The method comprising feeding the exposure device with an initial overlay model. The semiconductor wafer with the first overlay marks is coated with a photoresist layer and a plurality of exposure fields incorporating second overlay marks is produced on the photoresist layer. As discussed above, the method involves measuring the overlay deviations by comparing a subset of the first overlay marks with corresponding ones of the second overlay marks to produce overlay model parameters. The model parameters are used to generate an amended overlay model. The amended overlay model is subsequently fed to the exposure device.

This aspect of the present disclosure applies the present method to the production of the semiconductor wafer, for example in a semiconductor process. The second overlay marks are generated in a photoresist layer coated on the surface of the semiconductor wafer. The amended overlay model is fed to an exposure device to provide individual overlay correction parameters for each separate exposure field on the semiconductor wafer.

BRIEF DESCRIPTION OF THE FIGURES

For a more complete understanding of the present invention and the advantages thereof, reference is now made to the following description and the accompanying drawings, in which.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

In the following, embodiments and/or implementations of the method and the system are described with respect to determining overlay stability during manufacturing of a semiconductor device on a semiconductor wafer. The embodiments, however, might also be useful in other respects, e.g., improvements in process control, improvements in identifying lot to lot variations of a layout pattern, yield enhancement techniques or the like.

Furthermore, it should be noted that the embodiments and/or implementations are described with respect to semiconductor wafers but might also be useful in other respects including but not limited to thin film elements. Other products, e.g., liquid crystal panels, ASICS, photovoltaic devices, or the like might also be produced as well.

Figure 1:
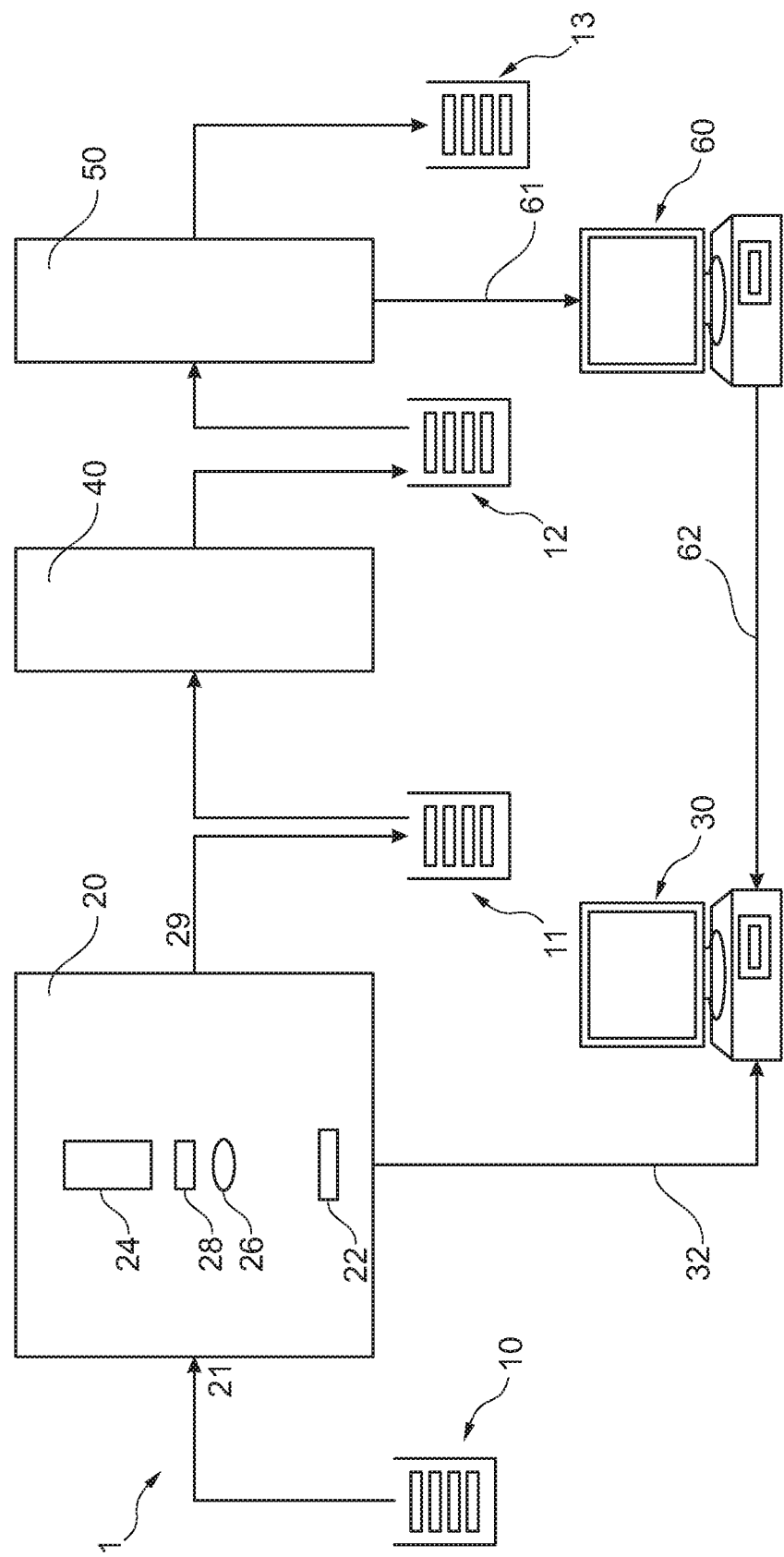
FIG. 1 shows a first aspect of the present disclosure.

FIG. 1 shows in a schematic view a fabrication unit 1 for patterning a surface of a semiconductor wafer 10 and performing an overlay calculation. The fabrication unit 1 forms part of a semiconductor manufacturing system. The fabrication unit 1 comprises an exposure tool 20 for aligning and exposing portions of the surface of the semiconductor wafers 10, an exposure controller 30, a developing unit 40 for developing exposed ones of the semiconductor wafers 11, and an overlay measurement tool 50.

A plurality of semiconductor wafers 10, usually referred to as a lot, is loaded into the exposure tool 20. The semiconductor wafers 10 loaded into the exposure tool 20 have been coated with a photoresist film in a preceding process step. The exposure tool 20 includes a load port 21 for loading the semiconductor wafers 10 and an unload port 29 for unloading exposed ones of the semiconductor wafers 11. Within the exposure tool 20 the semiconductor wafers 10 are placed on a substrate holder 22.

A typical one of the semiconductor wafers 10 comprises a plurality of exposure fields 70 arranged on the semiconductor wafer 10 in a grid-like pattern, as schematically shown in FIG. 2. The plurality of exposure fields 70 usually are exposed one exposure field 70 after another exposure field 70. For this purpose, the substrate holder 22 is positioned by actuators (not shown) at least in two dimensions. Thus, each one of the exposure fields 70 on the semiconductor wafer 10 is positioned in turn under a projection system 24, 26, 28 as the semiconductor wafer 10 is stepped back and forth, and up and down within the substrate holder 22. The projection system comprises a radiation source 24, a projection optic 26, and a photo mask 28. The semiconductor wafer 10 includes alignment marks that are used by the exposure tool 20 to align the surface of the semiconductor wafer 10 with the radiation source 24 and the projection optic 26 to ensure that the correct exposure field 70 is illuminated. There is generally one alignment mark per exposure field, but this is not limited of the invention. The radiation source is typically ultra-violet or extreme ultra-violet light but could also comprises particles such as an ion beam or electron beam.

Each time the semiconductor wafer 10 and the projection system 24, 26, 28 have been aligned, the photo mask 28 is illuminated with the radiation source 24 and the pattern from the photo mask 28 is projected on each individual exposure field 70 one at a time. The pattern on the photo mask 28 is used to generate a structure of one layer of the semiconductor device as well as overlay marks 71.

The overlay marks 71 are used to determine correction parameters to be used by the exposure tool 20 to project the photo mask 28 onto the correct portion of the surface of the semiconductor wafer 10 for the exposure field 70. Other ones of the overlay marks 71 will have been generated in a lower layer during a previous process step by a different exposure pattern in a previous photoresist layer during the exposure of the structure for this previous semiconductor layer (i.e. for a lower semiconductor layer). These lower overlay marks 71 in the previous photoresist layer are visible through later (upper) photoresist layers, as the photoresist layer is transparent. These lower overlay marks will be termed "reference marks" 74. Generally, there are a plurality of overlay marks.

The overlay error is the difference between the expected position of the individual exposure field 70 and the actual position of the pattern of the individual exposure field 70. The overlay error is calculated as described below. The overlay error can be corrected between specific pairs of the semiconductor layers of the semiconductor wafer 10. Different reference marks 74 are provided on different ones of the semiconductor layers and it is possible to see different ones of the reference marks 74 through multiple layers.

The overlay error is often due to semiconductor wafer deformations, which are introduced to a semiconductor wafer 10 during the various process steps to which the semiconductor wafer 10 is exposed. The overlay error is measured by the overlay measurement tool 50 which passes measurement data to the process correction unit 60. The process correction unit 60 determines process correction parameters and passes the process correction parameters to the exposure controller 30. The exposure controller 30 uses the process correction parameters to control the exposure tool 20 and to calculate the portion of the semiconductor wafer 10 onto which the pattern is to be projected. The process correction parameters provided by the process correction unit 60 are calculated for each one of the semiconductor wafers 10 (termed wafer fine model correction parameters) and each one of the exposure fields 70 (termed field fine correction parameters) on the semiconductor wafer 10. With the calculated process correction parameters, the semiconductor wafer 10 or the photo mask 28 can be shifted in either one or both of the x-direction or the y-direction, can be rotated around a vertical z-axis, or the projection system may be adjusted to a different magnification by disposing the projection system along the z-axis. The calculation of the individual process correction parameters for the semiconductor wafer 10 and the exposure fields 70 will be explained in more detail further down in the specification.

After the mask projection step, e.g. after all of the exposure fields 70 have been exposed with the pattern of the photo mask 28, each fully exposed semiconductor wafer 11 is unloaded via unload port 29 and the next semiconductor wafer 10 of the lot is loaded into the exposure tool 20 via the load port 21. After all of the exposed semiconductor wafers 11 of a lot have been exposed in the exposure tool 20, the entire lot of the exposed semiconductor wafers 11 is subsequently forwarded to a developing unit 40. In the developing unit 40 the exposed photoresist film on the top surface of the exposed semiconductor wafers 11 is developed by developing chemicals that wash away those unexposed areas of the photoresist film. In other words, a pattern of photoresist film is formed on the surface of the semiconductor wafer 10 that is based on whether or not the portions of the surface were exposed to light of the radiation source 24 passing through the photo mask 28. It will be noted that, for the sake of brevity, intermediate process steps that might be required, such as post-exposure bake and the like, are not discussed.

The lot of the exposed and developed semiconductor wafers 12 is then passed to the overlay measurement tool 60. The overlay measurement tool 60 can be an integral part of fabrication unit 1, although other configurations are conceivable as well. In the actual exposure step the overlay marks 71 that correspond to the reference marks 74 of a specific layer have been exposed to the photoresist layer. After the development step these overlay marks 71 are visible in the developed photoresist layer and are termed photoresist marks 75.

Figure 3A:
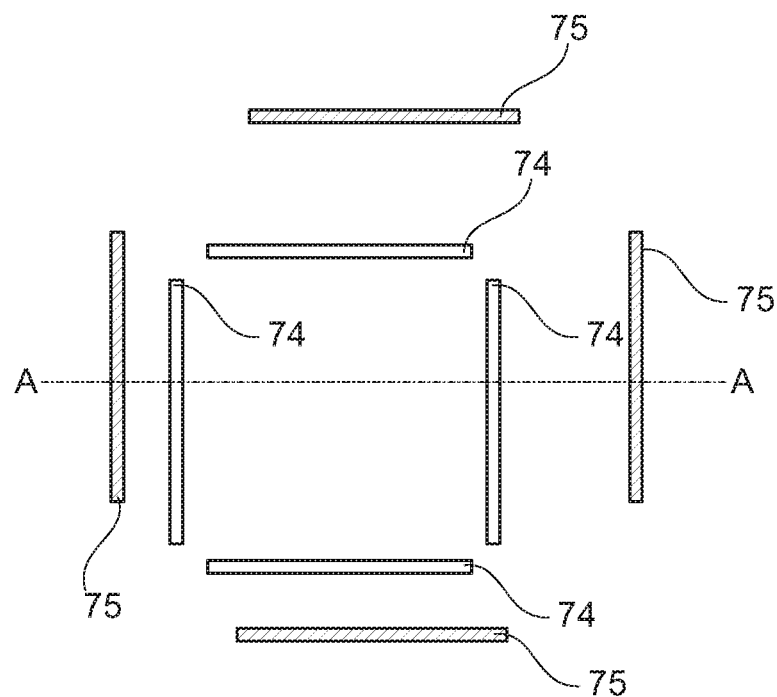
FIG. 3A shows first overlay marks and second overlay marks from a top view.
Figure 3B:
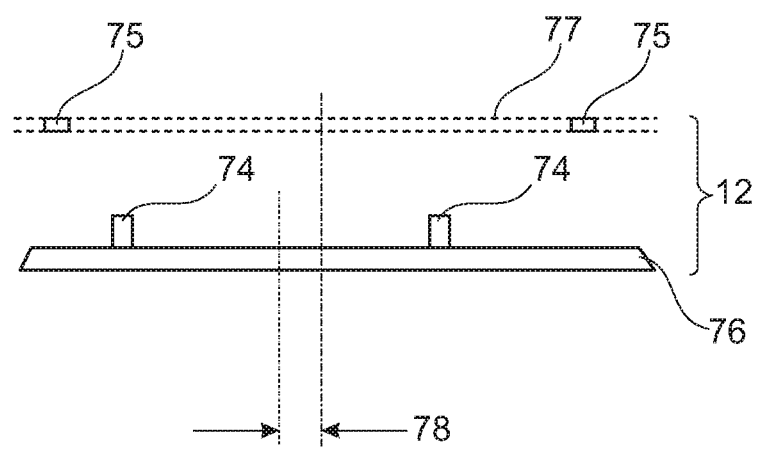
FIG. 3B shows first overlay marks and second overlay marks from a cross-section view.

FIG. 3 shows a typical pattern used for the reference marks 74 and the photoresist marks 75. FIG. 3A shows the reference marks 74 and the photoresist marks 75 from a top view and FIG. 3B shows the same reference marks 74 and the photoresist marks 75 as a cross sectional view along the line A-A of FIG. 3A. Some of the reference marks 74 may have been placed initially on the semiconductor wafer 10 at the beginning of the process during a first level lithography or in a special zero level lithography. Other ones of the reference marks 74 (for reasons of clarity not shown in FIG. 3) may have been placed in a later process step on a now intermediate layer.

The reference marks 74 can also be created on the unprocessed semiconductor substrate 76 that will later be part of the semiconductor wafer 10. The semiconductor wafers 10 then undergo many processing steps such as wet etching, dry etching, chemical mechanical planarization (CMP), oxide growth, metal deposition, to name a few. These processing steps change the appearance of the reference marks 74. As the later added layers are substantially transparent the reference marks 74 of different ones of the layers may be simultaneously visible.

The overlay measurement tool 50 measures the relative deviation 78 between corresponding reference marks 74 and photoresist marks 75. The deviations 78 may be measured as deviations in x-direction and y-direction. However, other measurement parameters, such as polar coordinates are conceivable as well.

With prior art overlay measurement tools 60 available at the time when the application was filed, the time taken for complete overlay measurement for a single one of the exposed and developed semiconductor wafers 12 is approximately twenty minutes, whereas a complete exposure step inclusive overlay correction of a single semiconductor wafer in the exposure tool 20 takes just 20 seconds.

Figure 2A:
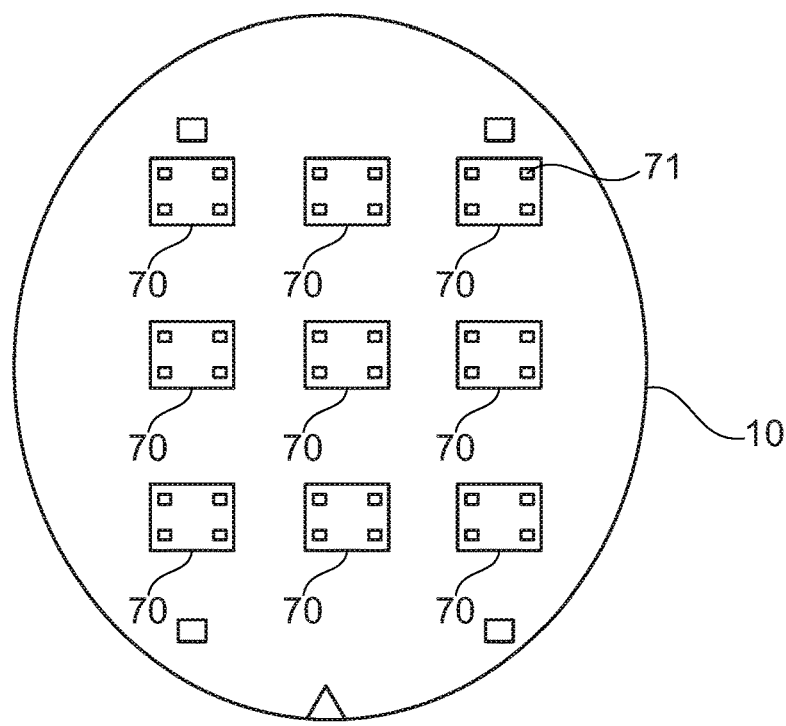
FIG. 2A shows wafer with exposure fields.
Figure 2B:
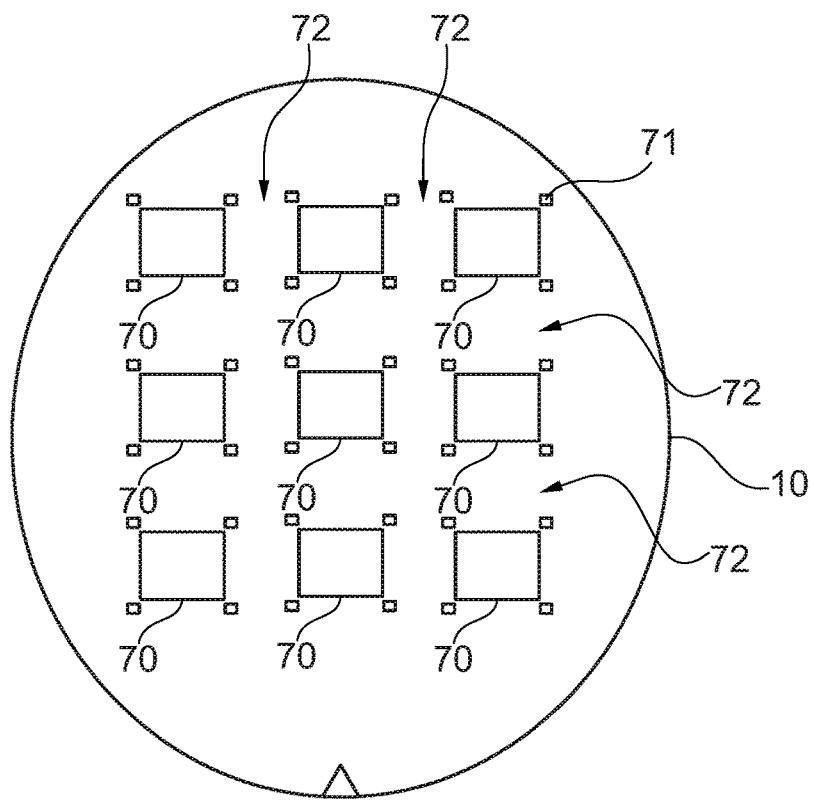
FIG. 2B shows another wafer with exposure fields.

FIG. 2 shows as one aspect of the present disclosure overlay marks 71 that are used on the exposed and developed semiconductor wafer 12. FIG. 2A shows a surface view of four individual overlay marks 71 in each one of the exposure fields 70. FIG. 2B shows a similar figure to FIG. 2A but it is clear from FIG. 2B that there are scribe lines 72 between the various chips, e.g. the various exposure fields 70. The overlay marks 71 are placed within scribe lines 72 in this FIG. 2B.

The overlay measurements on the exposure fields 70 of the semiconductor wafers 10 are done for two reasons. The first reason is to determine the disposition of the photoresist pattern with respect to the lower layers, e. g. determine whether there is a good value of the overlay or whether the overlay error is large. In case the disposition of the photoresist patter is so large that a deposition layer created in the next process step would not match with the layers underneath and would cause a failure of the manufacture semiconductor chip, the photoresist film 77 with the photoresist pattern can be removed from the upper surface of the exposed and developed semiconductor wafer 12. In this case, after removal of the photoresist film 77, the semiconductor wafer 12 can be coated with a new photoresist film 77 and finally can be exposed again in the exposure tool 20 to create a new photoresist pattern.

The second reason for the overlay measurements is to use the overlay measurements to calculate individual process correction parameters for each exposure field 70, which are then used to compensate for process errors.

It is shown in FIG. 2 that several overlay marks 71 are created which form a test structure for each exposure field 70 for each single overlay measurement. A common approach is to arrange an overlay mark 71 at each corner of the exposure field 70 and one overlay mark 71 in the middle of each exposure field 70. Other patterns of the test structure are conceivable. The measured deviations between the several overlay marks 71 of a test structure for each exposure field 70 with respect to the reference marks 74 are used to determine a plurality of correction parameters for each individual exposure field 70 as well as correction parameters for the wafer 10. There are at least ten correction parameters which usually are applied:

Wafer translation in x-direction and y-direction ($T_x$, $T_y$);

Wafer magnification in x-direction and y-direction ($M_x$, $M_y$);

Wafer rotation in x-direction and y-direction ($R_x$, $R_y$)

Field magnification in x-direction and y-directions ($FM_x$, $FM_y$); and

Field rotation in x-direction and y-direction ($FR_x$, $FR_y$).

The correction parameters $T_x$, $T_y$, $M_x$, $M_y$, $R_x$ and $R_y$ are the wafer fine correction parameters, i.e. they operate at the wafer level. The correction parameters $T_x$, $T_y$, $FM_x$, $FM_y$, $FR_x$ and $FR_y$ are correction parameters for each of the exposure fields. The correction parameters $T_x$, $T_y$, $FM_x$, $FM_y$, $FR_x$ and $FR_y$ have both a wafer fine component and a field fine component. In other words, for each of the exposure field there is a correction parameter calculated across the whole of the wafer and another which is specified to the exposure field 70, as described above.

Figure 4A:
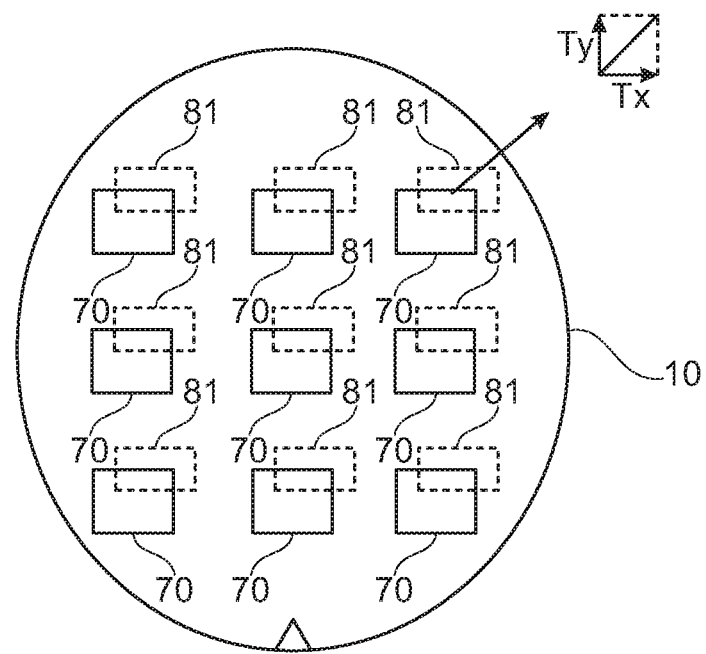
FIG. 4A shows a wafer with translation geometric errors.
Figure 4B:
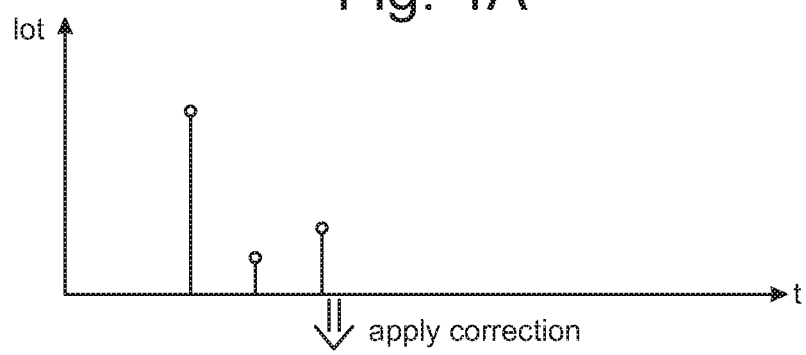
FIG. 4B shows a drift of geometric errors over time.
Figure 4C:
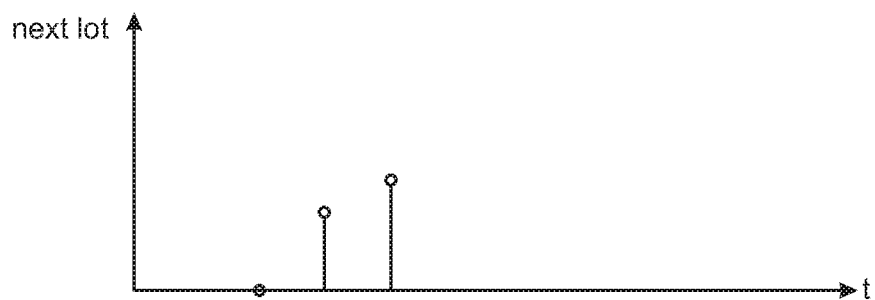
FIG. 4C shows the geometric errors in a subsequent lot after application of correction parameters.

As a first (non-limiting) example, FIG. 4A shows the semiconductor wafer 10 with a linear drift over time t compared to previous exposure fields 70. Each actual exposed and developed exposure field 81 is translated in a similar direction and by a similar value. The direction of translation is expressed as a translation vector with a component in an x-direction $T_x$ and a component in a y-direction $T_y$. For reasons of clarity the overlay marks 71 and 74 are not shown in FIG. 4A. It is found from experience that there is a drift over time. FIG. 4B depicts a typical translation evolution in x-direction over time t. Accordingly the process correction parameters P ($T_x$) need to be calculated to take into account this translation and are applied in the next lot (FIG. 4C shows the application of the process correction parameters).

Figure 5A:
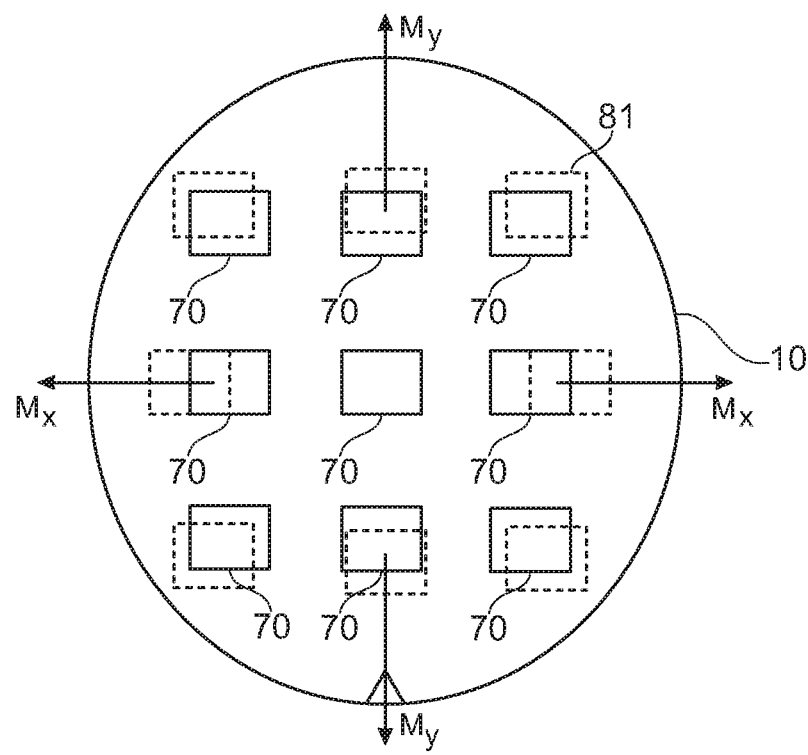
FIG. 5A shows magnification errors on a wafer.
Figure 5B:
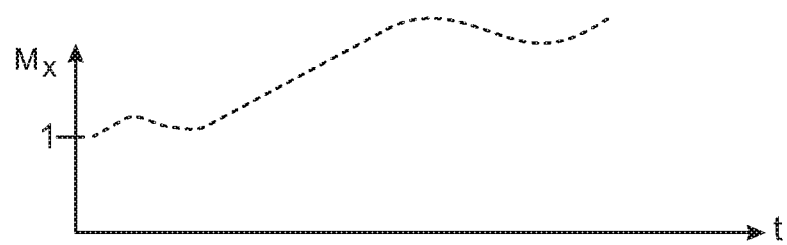
FIG. 5B shows the drift of the magnification error over time for the x-axis of a wafer.
Figure 5C:
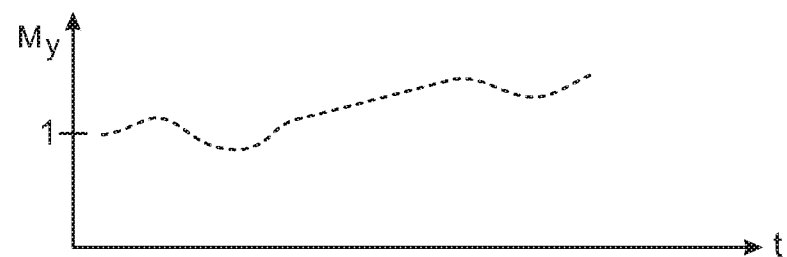
FIG. 5C shows the drift of the magnification error over time for the y-axis of a wafer.

As a second (non-limiting) example, FIG. 5A shows a semiconductor wafer 10 with previous exposure fields 70 and actual exposure fields 81. For reasons of clarity the overlay marks are not shown in FIG. 5A. The actual exposure fields 81 deviate radially from the centre of the semiconductor wafer 10 and the amount of deviation is proportional to their distance from the centre of the wafer 10 and thus this type of error is known as a magnification error. The magnification error may be different in an x-direction $M_x$ and in a y-direction $M_y$ and is expressed by two vectors $M_x$ and $M_y$. FIG. 5B shows the magnification error $M_x$ in x-direction over the wafers n of a lot. FIG. 5C shows the magnification error $M_y$ in y-direction over the semiconductor wafers n of the same lot. As can be clearly seen from FIG. 5B and FIG. 5C, the magnification errors $M_x$ and $M_y$ are not necessarily correlated.

As illustrated, there is a certain amount of drift in the overlay over time, as FIG. 4 show for translation errors and FIGS. 5B and 5C show for magnitude errors. This drift over time requires a process correction to take place. A formula to calculate the process correction parameter is shown in formula 1. Formula 1 gives the correction parameter corr $\{Lot_n; P\}$ for lot n for anyone of the correction parameters P, wherein P represents one of the ten parameters $T_x$, $T_y$, $M_x$, $M_y$, $R_x$, $R_y$, $FM_x$, $FM_y$, $FR_x$, $FR_y$. $w_i$ is a weighting factor that is used for the correction parameters P.

$$corr\{Lot_n; P\} = \frac{\sum_{i=1}^{k} w_i(\text{used } corr\{Lot_{n-i}; P\} + meas \cdot corr\{Lot_{n-i}; P\}}{\sum_{i=1}^{k} w_i} \quad \text{Formula 1}$$

Equation in formula 1 further shows that the correction parameter P for a lot n, is a weighted sum of the previously used process correction parameters for previous k lots plus measured errors, normalised by the sum of the weighting factors.

Ideally the applied process correction parameters would fully compensate for all of the process deviations. However, FIG. 4C shows that in reality only at the beginning of a next lot can the process deviation be substantially anticipated. The process deviation is substantially around zero for the first semiconductor wafer 10 in the following lot. With increasing wafer number in the next lot, the process deviation drifts, despite the applied process correction parameters. The cause of these process drifts is a non-linear deformation of the semiconductor wafer 10. It should be appreciated that the calculation of the process correction parameters according to formula 1 will compensate linear deformations but is not suitable for non-linear deformation. For non-linear deformation a polynomial correction may be used, for example according to formula 2.

$$dx = \sum_{i=0}^{5} \sum_{j=0}^{5} \sum_{k=0}^{1} \sum_{l=0}^{1} c_{ijkl} X_w^i Y_w^j X_b^k Y_b^l \quad \text{Formula 2}$$

However, as for polynomial correction each one of the exposure fields 70 has to be measured and thus this approach is very time consuming. The present disclosure teaches a method for a correction per exposure field 70, which is termed field fine correction.

Figure 6A:
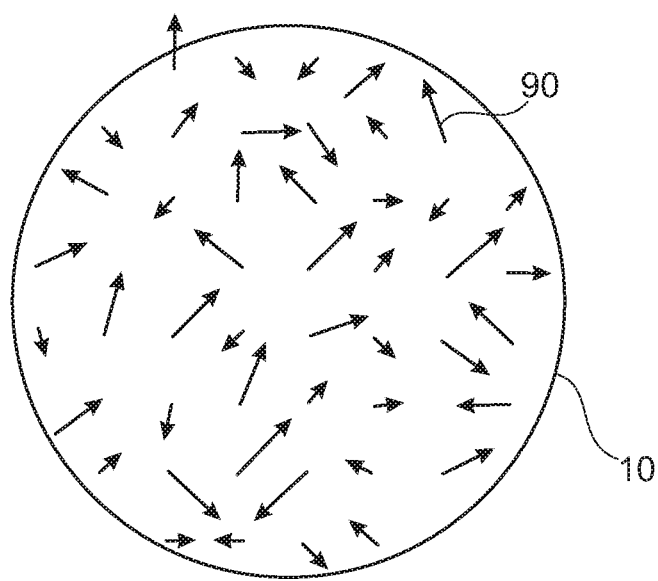
FIG. 6A shows a wafer with non-linear errors.
Figure 6B:
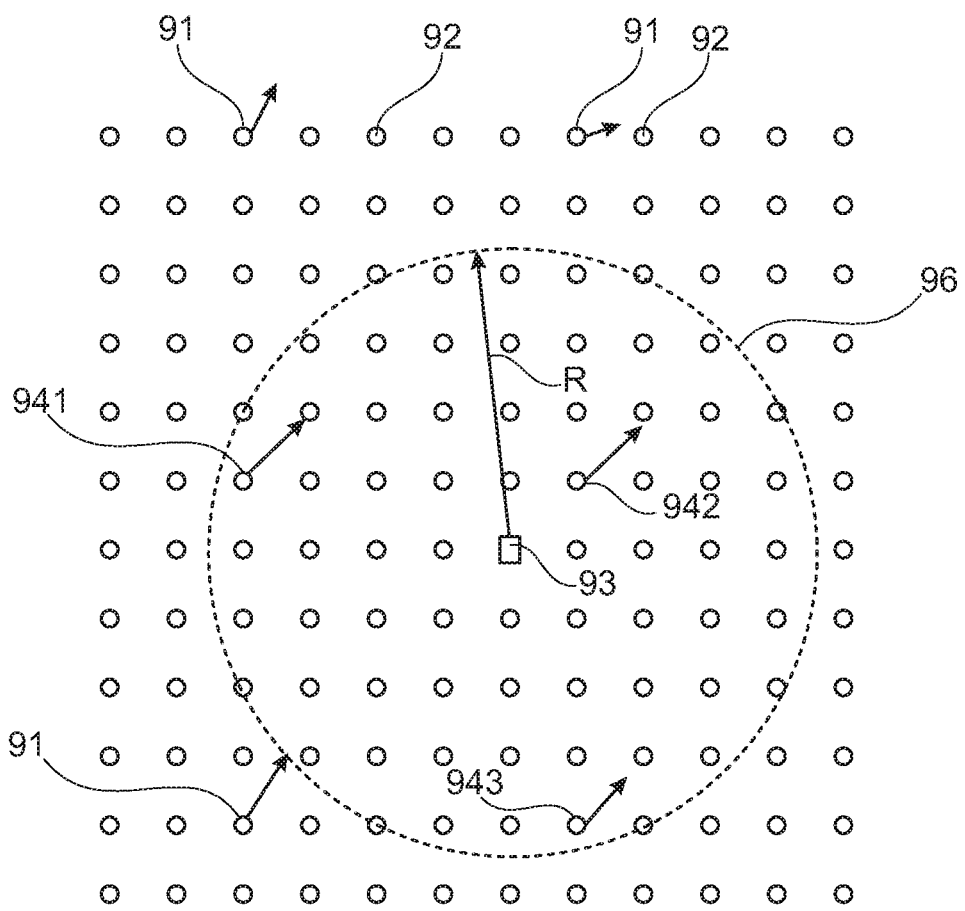
FIG. 6B shows a magnified section of the wafer and the non-linear errors.

FIG. 6A shows an example of the semiconductor wafer 10 with the non-linear overlay errors in the exposure fields 70 indicated as small arrows 90. FIG. 6B shows a magnified section of the semiconductor wafer 10. The small circles 91, 92 indicate the middle of the exposure field 70. A perfect compensation for the non-linear overlay errors would be only possible if the overlay marks 71 of each one of the exposure fields 70 would be measured. The present method of the disclosure however measures only the overlay marks 71 of a subset of the exposure fields 70 and applies an interpolation algorithm for calculating the process correction parameters for exposure fields 70 in between the measured subset of exposure fields 70. This approach is based on the finding, that the variation of the non-linear errors is sufficiently correlated in a region between neighbouring overlay marks 71 of a subset of overlay marks, in the event the distance between the subset of overlay marks 71 is chosen appropriately.

In FIG. 6B the circles with a filled body 91 indicate the exposure fields 70 for which the non-linear overlay errors have been measured in the overlay measurement tool 50. The circles with a non-filled body 92 indicate the exposure fields 70 for which no overlay measurements have been performed.

Suppose one wishes now to calculate the process correction parameters for the overlay point 93 of the exposure field

70. As indicated in FIG. 6B, the present disclosure teaches the use only of those overlay marks 941, 942, 943 of those exposure fields that are in a certain proximity of the exposure field 93 for which the correction parameters should be interpolated. A so-called horizon 96 is defined which is expressed by a radius R around the overlay point 93 of the specific exposure field for which the process correction parameters should be applied. FIG. 6B shows overlay marks 91 that are outside the horizon 96 and therefore are not taken into account for the calculation of process correction parameters of the specific exposure field 70. In contrast all of the identified overlay marks 941, 942, 943 within the horizon R are weighted according to their distance d from the overlay point 93.

In one aspect of the invention, the overlay point 93 is the geometric middle of the exposure field in question. Then all of the measured deviations of the overlay marks within the horizon R are calculated and are weighted using a weighting factor which for example may be either given as $1/d^2$ or $\exp(-d^2/\delta^2)$ in which d is the distance from the overlay point 93 to the measured overlay mark 941, 942 or 943. This means that the corrections applied to the overlay marks 941, 942 or 943 further away from the overlay point 93 are given less weighting.

$$dx_i = T_x + M_x \cdot X_{dist_i} - R_x \cdot X_{dist_i} + \Sigma i \qquad \text{Formula 3:}$$

$$dy_i = T_y + M_y \cdot Y_{dist_i} + R_y \cdot Y_{dist_i} + \Sigma i \qquad \text{Formula 4:}$$

Formula 3 shows the overlay error for each of the points in x-direction and Formula 4 shows the overlay error for each of the points in y-direction. In order to minimize the error a least square fit is carried out for each one of the exposure fields for both the x-direction and y-direction in order to give the value of $\Sigma t$.

$$(\Sigma i)^2 = (dx_i - (T_x + M_x \cdot X_{dist_i} - R_x \cdot Y_{dist_i}))^2 \qquad \text{Formula 5:}$$

$$(\Sigma i)^2 = (dy_i - (T_y + M_y \cdot Y_{dist_i} + R_y \cdot X_{dist_i}))^2 \qquad \text{Formula 6:}$$

The process correction unit 60 of the present disclosure measures only a subset of the exposed and developed semiconductor wafers 12 of the whole lot. The measured data of the subset of the exposed and developed semiconductor wafers 12 is used to estimate data for other ones of the exposed and developed semiconductor wafers 12 of the lot that has not been selected for the overlay measurement. A subset for a lot of twenty-five semiconductor wafers for example could comprise three wafers. The number of semiconductor wafers 12 picked for measurement is user configurable as well as the selection strategy. Obviously, the more samples of the semiconductor wafers 12 that are chosen the more accurate the estimated data will be. If the statistical variations of the semiconductor manufacturing process are relatively low, a smaller number of samples of the semiconductor wafers 12 will suffice to obtain sufficiently accurate estimations. If the statistical variations increase the number of selected semiconductor wafers may be increased accordingly.

The results of the measurement are stored in a process correction unit 60. Over time the process correction unit 60 has a history of stored measurements and is able to calculate estimates for process correction parameters for the semiconductor wafers 10 that have not been measured. The estimated process correction parameters are provided to the exposure controller 30 for correcting the exposure alignment for a next lot of the semiconductor wavers 10.

One semiconductor wafer selection strategy is to measure always the same semiconductor wafers of a subsequent lot. For example, for a lot of twenty-five semiconductor wafers 12 the overlay measurement tool 50 measures always the first semiconductor wafer 10 of a lot, the semiconductor wafer 10 in the middle of the lot, which would be, in lot of twenty-five wafers, the thirteenth wafer and the last semiconductor wafer 10 of a lot. Other measurement strategies can be configured, like randomly measuring three semiconductor wafers 10 out of the whole lot. Another selection strategy that could be selected is to measure a certain number of the same semiconductor wafers 10 every time and measuring in addition hereto a certain number of randomly selected semiconductor wafers 10. As the process correction procedure of the disclosure is based on a mathematical model, all kinds of semiconductor wafer selection strategies can easily be implemented by the teachings of this disclosure.

In a further aspect of the invention it is possible to use a series of overlay measurements calculated for different lots prior to a current overlay measurement for the current lot n. For example, overlay measurements are carried out for the lots at n-1, n-2, n-3, n-4 and n-5. Each of the overlay measurements is weighted by an individual factor $\lambda$. For example, the previous overlay measurement for lot n-1 is weighted with $\lambda^1$, the overlay measurement for the lot prior to the previous overlay measure n-2 is weighted with $\lambda^2$, and similarly for the previous overlay measurement n-3 is weighted with $\lambda^3$, the previous overlay measurement n-4 is weighted with $\lambda^4$ and the previous overlay measurement n-5 is weighted with $\lambda^5$. As the value for the factor $\lambda$ is chosen in the range between 0 and 1, the most recent overlay measurements for the most recent lots are given a higher weight than previous overlay measurements. By the use of the factor $\lambda$ a moving average is achieved.

The weighting measurements can be made as shown in formula 5 and formula 6 with an adapted weighting factor. As formula 7 shows, this adapted weighting factor $w_{i,\,lot\,K}$ is a function of the average distance $\langle d \rangle$ for each exposure field and each different lot K. The average distance $\langle d \rangle$ denotes the average distance of the marks from the overlay point of the exposure field and is given by the number of marks N within the horizon 96 divided by the total distance.

$$w_{i,lot\,K} = f(\langle d \rangle, N) \qquad \text{formula 7}$$

Formula 8 gives an example for the weighting function $w_{i,\,lot\,K}$:

$$w_{i,lot\,K} = \frac{N}{\langle d \rangle} \qquad \text{formula 8}$$

Figure 7:
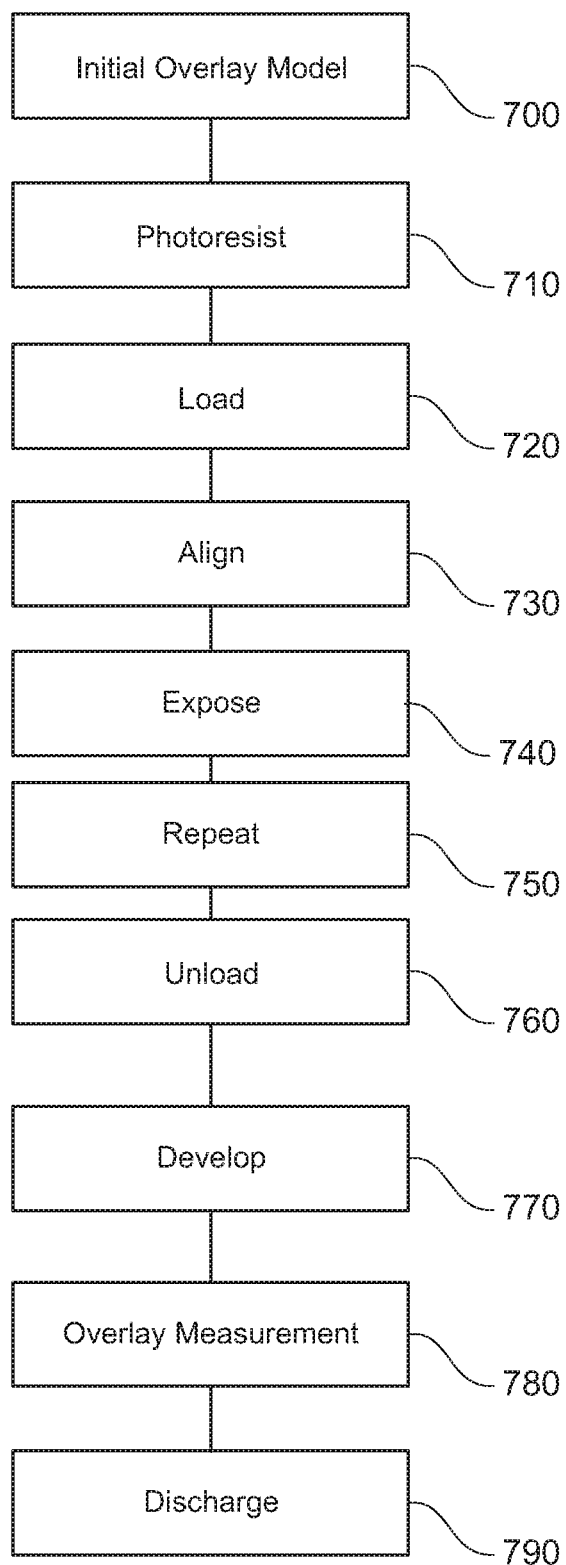
FIG. 7 shows a flow diagram of the method of this disclosure.

The method for calculating the overlay model is shown in FIG. 7. In a first step 700 an initial overlay model is fed into the exposure tool 20 and the semiconductor wafer 10 covered with the photoresist layer in step 710. The initial overlay model comprises the process correction parameters calculated for the previous lot. In a load step 720 the coated semiconductor wafer 10 is loaded into the exposure tool 20. In an alignment step 730 the semiconductor wafer is aligned in the exposure tool 20 using the alignment marks. After alignment, the exposure field 70 of the semiconductor wafer 10 is exposed in exposure step to 740 using the overlay model. The last two steps are repeated (step 750) until all fields of the wafer are exposed in the exposure tool 20. In an unload step 760 the exposed wafer 11 is unloaded and developed 770 in a development tool 30. In this development step 770 the photoresist marks 75 become visible.

The exposed and developed semiconductor wafer 12 is loaded into an overlay measurement device 50 for overlay measurements 780. Using the measurement results of overlay measurement step 780 a decision 790 is taken whether to discharge a wafer for reprocessing 791 the semiconductor wafer with adapted process parameters or to pass 792 the semiconductor wafer to the next process step.

Figure 8:
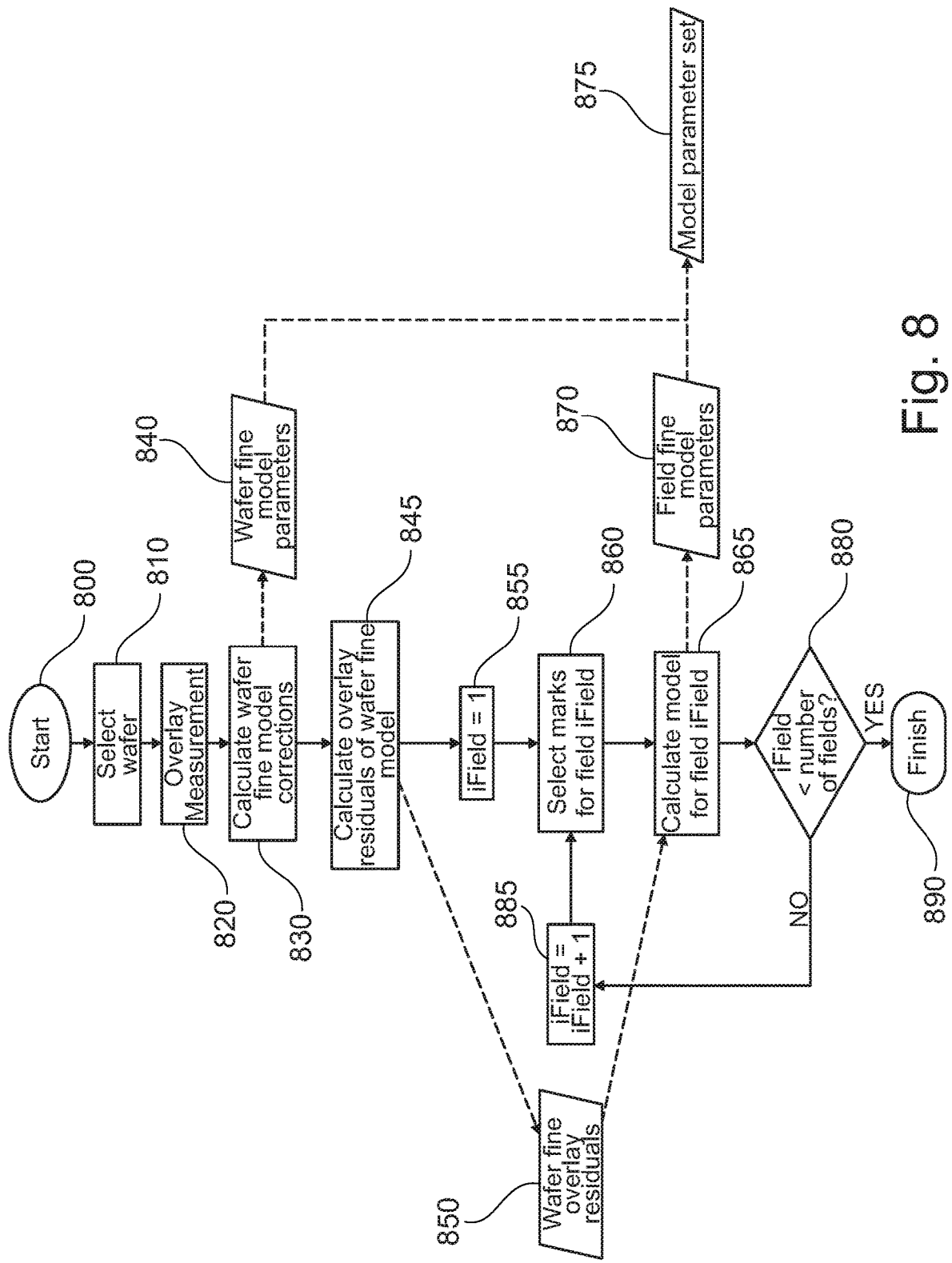
FIG. 8 shows a flow diagram of the measurement method.

The overlay measurement step 780 is now explained in more detail with reference to FIG. 8, which shows both a process flow (indicated by continuous lines) and a data flow (indicated by dashed lines). The process flow begins at start 800 and is followed by a wafer selection step 810 in which only a subset of the exposed and developed wafers 12 of a lot is selected for overlay measurement in step 820 to generate the overlay measurement data 835. In step 830, the wafer fine model correction parameters 840 are calculated by measuring from the overlay measurements obtained in step 820.

After the wafer fine model correction parameters 840 have been calculated, the overlay residuals 850 are calculated in step 845. The overlay residuals 850 are the part of the measured overlay differences that cannot be accounted for by the wafer fine correction parameters 840. The overlay residuals 850 are calculated in step 45 for each of the measurements. The overlay residuals 850 are input data into the overlay model for the individual ones of the exposure fields 70. For each of the exposure fields 70 on the wafer (loop formed between step 855 and 885 with counter iField) the overlay marks 71 for calculating the field fine correction parameters 870 for the exposure field 70 represented by the counter iField are selected in step 860. These are the overlay marks 71 falling within the horizon 96, discussed above. In step 865 the field fine correction parameters 870 for the selected one iField of the exposure fields 70 are calculated to give a data set 870 which is added to the model correction parameter set 875. The model correction parameter set 875 can be fed to the exposure tool 20.

The method finishes in step 890 when all of the field fine correction parameters have been calculated and fed into the model correction parameter set 875.

The present disclosure further relates to a computer program product embedded on a computer readable medium. The computer program product comprises executable instructions for the measurements on wafers and the manufacture of wafers.

While various embodiments of the present invention have been described above, it should be understood that they have been presented by way of example, and not limitation. It will be apparent to persons skilled in the relevant arts that various changes in form and detail can be made therein without departing from the scope of the invention. For example, in the present disclosure the wafer has been exposed to a radiation source. However, it is well known to use other sources of illumination, such as electron beams, x-rays or similar sources of electromagnetic energy with wavelengths much shorter than light. Thus, the present invention should not be limited by any of the above-described exemplary embodiments but should be defined only in accordance with the following claims and their equivalents.

In addition to using hardware (e.g., within or coupled to a Central Processing Unit ("CPU"), microprocessor, microcontroller, digital signal processor, processor core, System on chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analogue-based medium). Embodiments of the present invention may include methods of providing the to apparatus described herein by providing software describing the apparatus and subsequently transmitting the software as a computer data signal over a communication network including the Internet and intranets. It is understood that the apparatus and method described herein may be included in a semiconductor intellectual property core, such as a microprocessor core (e.g., embodied in HOL) and transformed to hardware in the production of integrated circuits. Additionally, the apparatus and methods described herein may be embodied as a combination of hardware and software. Thus, the present invention should not be limited by any of the above-described exemplary embodiments but should be defined only in accordance with the following claims and their equivalents.

What is claimed is:

1. An apparatus for fabrication of a wafer with a structural pattern comprising:
   an exposure tool for exposure of the wafer;
   an overlay measurement tool for measuring a subset of overlay deviations between lower first overlay marks and second overlay marks in a photoresist layer on the wafer, wherein the overlay measurement tool is adapted to select only those overlay marks within a specified distance to one of a plurality of exposure fields; and
   a process correction unit connected to the overlay measurement tool, wherein the process correction unit is configured to:
      accept the measured subset of overlay deviations,
      calculate from the overlay deviations wafer fine model corrections parameters,
      for a plurality of overlay positions estimate overlay residuals from the wafer fine model correction parameters, calculate a set of field correction parameters for the exposure tool from the overlay residuals, and
      provide the wafer fine model correction parameters and the set of field correction parameters to the exposure tool.

2. The apparatus of claim 1, further comprising an etching unit for etching a pattern onto a surface of the exposed wafer.

* * * * *